United States Patent
Xiao et al.

(10) Patent No.: US 8,972,821 B2
(45) Date of Patent: Mar. 3, 2015

(54) ENCODE AND MULTIPLEX, REGISTER, AND DECODE AND ERROR CORRECTION CIRCUITRY

(75) Inventors: Yanyang Xiao, Bellaire, TX (US); Alexandre Pierre Palus, Sugarland, TX (US); Karl Friedrich Greb, Sugarland, TX (US); Kevin Patrick Lavery, Sugarland, TX (US); Paul Krause, Sugarland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 312 days.

(21) Appl. No.: 13/330,877

(22) Filed: Dec. 20, 2011

(65) Prior Publication Data

US 2012/0173924 A1    Jul. 5, 2012

Related U.S. Application Data

(60) Provisional application No. 61/525,064, filed on Aug. 18, 2011, provisional application No. 61/427,048, filed on Dec. 23, 2010.

(51) Int. Cl.
| | |
|---|---|
| G11C 29/00 | (2006.01) |
| G06F 11/00 | (2006.01) |
| G06F 11/10 | (2006.01) |
| G11C 29/52 | (2006.01) |
| G11C 29/48 | (2006.01) |

(Continued)

(52) U.S. Cl.
CPC ............ *G06F 11/1048* (2013.01); *G11C 29/52* (2013.01); *G11C 29/00* (2013.01); *G11C 29/48* (2013.01); *G06F 11/1016* (2013.01); *G06F 11/1008* (2013.01); *G11C 29/14* (2013.01); *G06F 11/1068* (2013.01); *H03M 13/27* (2013.01); *G06F 11/1641* (2013.01); *G06F 11/1654* (2013.01)

USPC ............ 714/763; 714/701; 714/702; 714/718; 714/768; 714/769; 714/773

(58) Field of Classification Search
CPC ........ G11C 29/00; G11C 29/52; G11C 29/48; G11C 29/14; G06F 11/1008; G06F 11/1016; G06F 11/1068; H03M 13/27
USPC ............ 714/701, 702, 718, 763, 768, 769, 77
See application file for complete search history.

(56) References Cited

U.S. PATENT DOCUMENTS

| | | | | |
|---|---|---|---|---|
| 5,754,566 | A | * | 5/1998 | Christopherson et al. .... 714/773 |
| 6,292,018 | B1 | * | 9/2001 | Kean .............................. 326/41 |

(Continued)

OTHER PUBLICATIONS

TMS570LS31x/21x 16/32-Bit RISC Flash Microcontroller: Technical Reference Manual. Lit. Nr: SPNU499, Sep. 2011, Texas Instruments Inc., Dallas, Texas. pp. 92-93, 368 FIGS. 1-1; 9-1.

*Primary Examiner* — John J Tabone, Jr.
(74) *Attorney, Agent, or Firm* — Lawrence J. Bassuk; Frederick J. Telecky, Jr.

(57) ABSTRACT

An electronic circuit includes a microcontroller processor (410), a peripheral (420) coupled with the processor, an endian circuit (470) coupled with the processor and the peripheral to selectively provide different endianess modes of operation, and a detection circuit (140) to detect a failure to select a given endianess, whereby inadvertent switch of endianess due to faults is avoided. Other circuits, devices, systems, methods of operation and processes of manufacture are also disclosed.

4 Claims, 8 Drawing Sheets

(51) Int. Cl.
  *G11C 29/14* (2006.01)
  *H03M 13/27* (2006.01)
  *G06F 11/16* (2006.01)

(56) References Cited

U.S. PATENT DOCUMENTS

| | | | |
|---|---|---|---|
| 6,732,322 B1 * | 5/2004 | Miyauchi et al. | 714/784 |
| 6,836,869 B1 * | 12/2004 | Wyland | 714/781 |
| 7,689,726 B1 * | 3/2010 | Sundararajan et al. | 710/8 |
| 7,730,248 B2 * | 6/2010 | Goss et al. | 710/261 |
| 7,793,200 B1 * | 9/2010 | Parekh et al. | 714/792 |
| 8,069,290 B2 * | 11/2011 | Conti et al. | 710/261 |
| 8,117,367 B2 * | 2/2012 | Conti et al. | 710/261 |
| 8,136,015 B2 * | 3/2012 | Kawai et al. | 714/763 |
| 8,225,147 B2 * | 7/2012 | Lablans | 714/701 |
| 8,254,167 B2 * | 8/2012 | Patapoutian et al. | 365/185.03 |
| 8,347,012 B2 * | 1/2013 | Goss et al. | 710/261 |
| 2004/0221173 A1 | 11/2004 | Moyer et al. | |
| 2005/0251650 A1 | 11/2005 | Filer et al. | |
| 2006/0129848 A1 | 6/2006 | Paksoy et al. | |
| 2007/0226795 A1 | 9/2007 | Conti et al. | |
| 2008/0215653 A1 * | 9/2008 | Fenzl et al. | 708/400 |
| 2009/0167496 A1 * | 7/2009 | Norman | 340/10.1 |
| 2009/0172308 A1 | 7/2009 | Prins et al. | |
| 2009/0274248 A1 * | 11/2009 | Hepler et al. | 375/341 |
| 2010/0138635 A1 | 6/2010 | Noyes | |
| 2010/0250875 A1 * | 9/2010 | Leung et al. | 711/155 |
| 2011/0072170 A1 | 3/2011 | Flachs et al. | |
| 2011/0153897 A1 | 6/2011 | Sakamaki et al. | |
| 2011/0225475 A1 * | 9/2011 | Kumar et al. | 714/763 |
| 2011/0248688 A1 * | 10/2011 | Iacob et al. | 323/234 |
| 2011/0276858 A1 * | 11/2011 | Tarui et al. | 714/763 |
| 2013/0145232 A1 * | 6/2013 | Grube et al. | 714/763 |

* cited by examiner

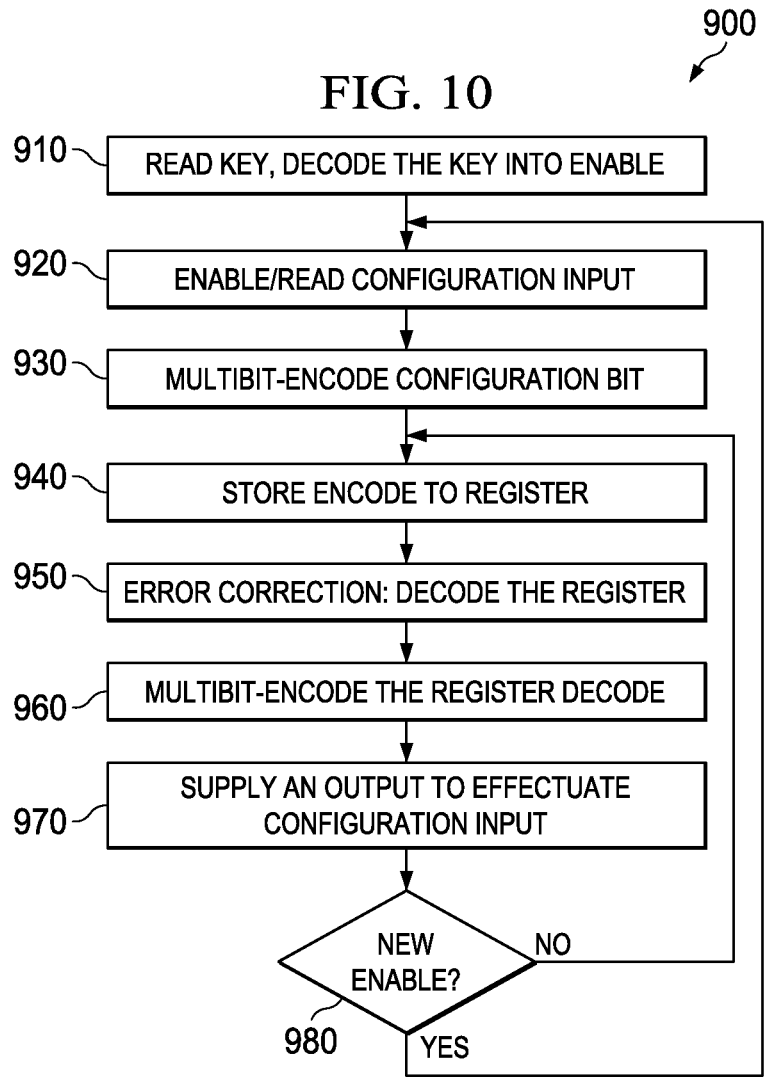

ENCODE AND MULTIPLEX, REGISTER, AND DECODE AND ERROR CORRECTION CIRCUITRY

CROSS-REFERENCE TO RELATED APPLICATIONS

This application is related to Provisional U.S. Patent Application "Dual Endianess and Other Configuration Safety in Lock Step Dual-Core System, and Other Circuits, Processes and Systems" Ser. No. 61/525,064 filed Aug. 18, 2011, for which priority is claimed under 35 U.S.C. 119 and all other applicable law, and which is incorporated herein by reference in its entirety.

This application is related to Provisional U.S. Patent Application "Dual Endianess Safety in Lock Step Dual-Core System" Ser. No. 61/427,048 filed Dec. 23, 2010, for which priority is claimed under 35 U.S.C. 119 and all other applicable law, and which is incorporated herein by reference in its entirety.

This application is related to US Patent Application Publication 20110225475 dated Sep. 15, 2011, "A Low Overhead and Timing Improved Architecture for Performing Error Checking and Correction for Memories and Buses in System-On-Chips, and Other Circuits, Systems and Processes," which is hereby incorporated herein by reference in its entirety.

STATEMENT REGARDING FEDERALLY SPONSORED RESEARCH OR DEVELOPMENT

Not applicable.

COPYRIGHT NOTIFICATION

Portions of this patent application contain materials that are subject to copyright protection. The copyright owner has no objection to the facsimile reproduction by anyone of the patent document, or the patent disclosure, as it appears in a governmental patent office to the extent they have a non-copyright right to do so, but otherwise reserves all copyright rights whatsoever.

BACKGROUND

Electronic micro-controlled systems have applications in vehicles subject to electrical noise and potential electrical interference and radiation as well as demanding applications of all types in which error-resistant performance is called for.

Microcontrollers and microprocessors generally have various kinds of configuration bits that establish system architecture, modes of operation therein, or other operations. An important problem in the art involves the challenge of ensuring that the intended electronic operations represented by such configuration bits are actually carried into effect. Without limitation, the description herein uses endianess as one example among various configuration bits to which the same challenge applies.

Endian or Endianess is used in the electronic circuitry arts to refer to the direction or ordering of electronic information bits from most significant bit (MSB) to least significant bit (LSB). "Endianess", "Bit ordering", or "ordering" herein encompasses any of various orderings by single bit, nibble, byte, half-word, word, double word, etc. The type of ordering can also depend on how the system implemented accesses and/or processes the lowest addressable chunk of a memory portion, and can also depend on the addressing used by an address generator. The ordering can be different at system level (e.g., by word), compared to CPU (e.g., by byte) and at interconnect (e.g., by double-word). In one example at byte level, big endian can refer to an ordering that has the most significant byte on the right side of a data bus, while little endian has the most significant byte on the left side of a data bus. Put another way, to obtain informationally-coherent operation it is important to couple to each other the electronic outputs and inputs in corresponding bit-ordered sense of different electronic circuits that handle multiple bits. The importance of consistency of endianess in electronic circuitry, or intelligent conversions between circuits having different kinds of endianess when needed sometimes, is somewhat analogous to the importance in a nation's highway system of consistently assigning forward moving vehicles to intended lanes (e.g. on right or on left).

Various configuration bits in an electronic circuit, device, system-on-chip (SoC), or other system can establish circuit operations that matter importantly in their own particular and diverse ways. Also, the risk of errors and reliability degradation can be exacerbated by the demand for more intelligent systems performance and the continuing decreases in microscopic transistor dimensions to provide large amounts of circuitry to support such performance. Accordingly, significant departures and solutions for confronting the challenge of preserving and protecting configuration information bits from being corrupted by noise, interference, alpha-particle errors and other sources of error, are needed and continue to attract high interest in the electronic arts.

SUMMARY OF THE INVENTION

Generally, and in one form of the invention, an electronic circuit includes a microcontroller processor, a peripheral coupled with the processor, an endian circuit coupled with the processor and the peripheral to selectively provide different endianess modes of operation, and a detection circuit to detect a failure to select a given endianess, whereby inadvertent switch of endianess due to faults is avoided.

Generally, and in another form of the invention, an electronic circuit includes a non-volatile memory holding at least one configuration datum, a multibit register, a decoding circuit coupled to receive bits from the multibit register and operable to decode the contents of the multibit register even in the presence of an error in those contents, an encoding circuit operable to supply a particular code to the multibit register from a set of predetermined multibit codes depending on the at least one configuration datum and then to supply that particular code to the multibit register depending on the decoded contents of the multibit register from the decoding circuit, and at least one control line coupled with at least one of the decoding circuit and the encoding circuit to deliver an error-resistant configuration-based output.

Generally, a further form of the invention involves a process or method of operating an electronic circuit that has a register subject to bit errors in case of interference or radiation. The process includes electronically reading a configuration bit field from a configuration store, encoding one or more configuration bits from the configuration bit field into a larger number of bits to form a multibit encode in a register, and decoding the register and multibit-encoding the decoding result to perform error correction in the register and to supply an output to effectuate the one or more configuration bits.

Generally, a still further form of the invention involves a process or method of manufacture comprising fabricating of a dual-mode endianess microcontroller, and programming a nonvolatile memory for the microcontroller with at least one configuration bit including an endianess configuration bit to form a mixed hardware/software device with an integrated endianess diagnostic, whereby providing diagnostic integration with one tape-out.

Other circuits, devices, systems, methods of operation and processes of manufacture are also disclosed and claimed.

BRIEF DESCRIPTION OF THE DRAWINGS

FIG. 10 is a flow diagram of a process embodiment of integrated circuit operation for increased configuration safety such as for endianess.

Corresponding numerals in different Figures indicate corresponding parts except where the context indicates otherwise. A minor variation in capitalization or punctuation for the same thing does not necessarily indicate a different thing. A suffix .i or .j refers to any of several numerically suffixed elements having the same prefix.

DETAILED DESCRIPTION OF EMBODIMENTS

Figure 1:
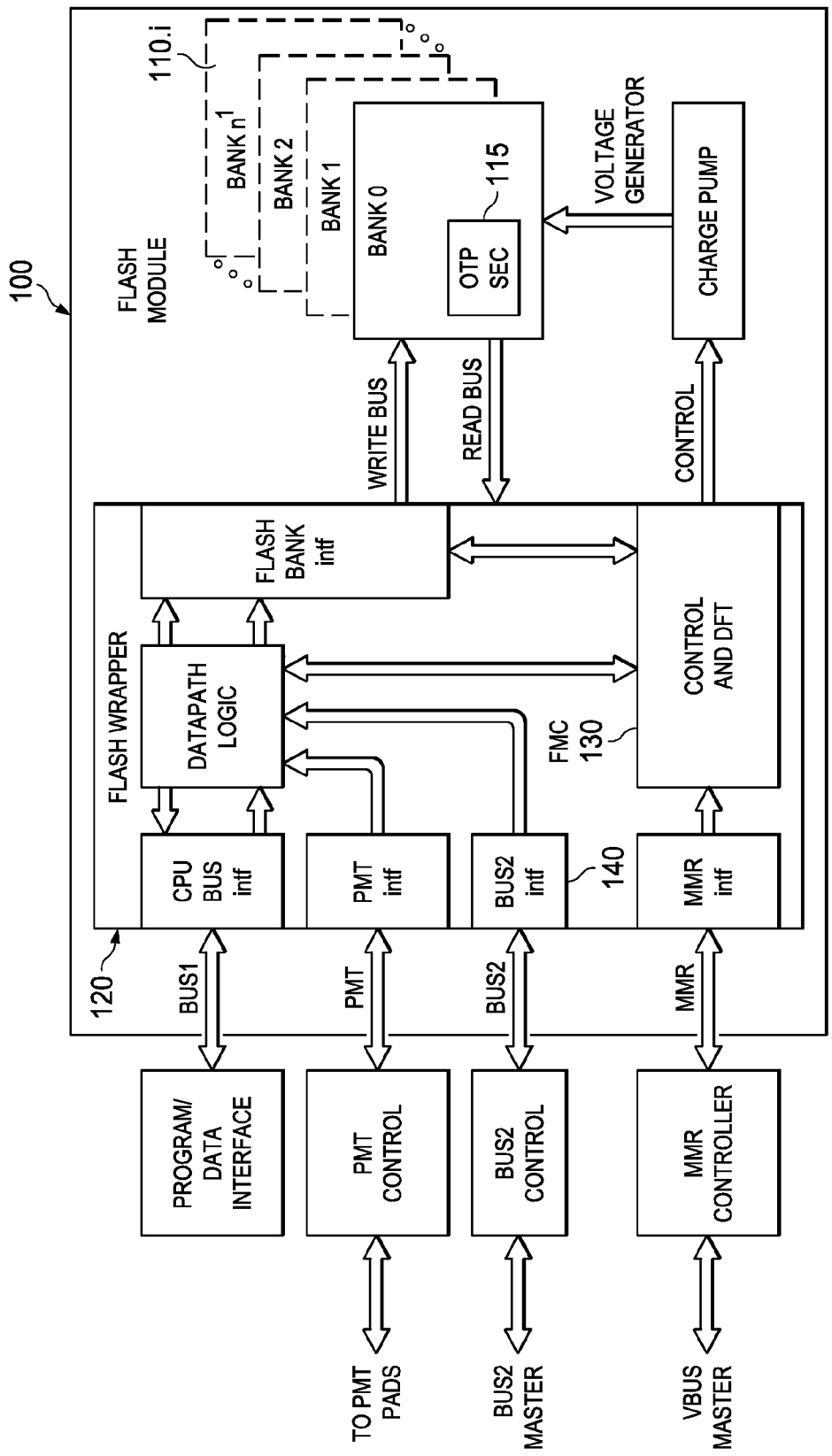
FIG. 1 is a block diagram of a flash memory module or other non-volatile memory module improved with circuits, devices, processes and systems of the other Figures.

In FIG. 1, a flash module 100 includes banks 110.i of flash memory that include at least some one-time programmable (OTP) memory space 115. The flash memory banks 110.i are coupled with a flash wrapper circuitry 120 that includes a flash bank interface coupled with the banks 110.i. A data path logic block is coupled with the flash bank interface. The data path logic block is also coupled with a Control and DFT (Design for Test) block, and together they are also called a flash memory controller FMC 130 herein.

The data path logic block communicates with a special BUS2 interface 140 (BUS2intf), a CPU bus interface, and a PMT interface. BUS2 interface 140 is coupled with a BUS2 bus master Bus2Control circuit, and BUS2 interface 140 together with Bus2Control provides ECC (error correcting code) based BUS2 communication on-chip for OTP memory and flash EEPROM (electrically erasable programmable read-only memory). BUS2 interface 140 further includes special configuration circuitry such as described in either of FIG. 2 or 3 to solve the above-mentioned problems in a system-on-chip in a remarkable DFT SoC structure and process such as based on or depicted in FIGS. 4-6.

Further in FIG. 1, the CPU bus interface in flash wrapper 120 is connected to a BUS1 that provides a program/data interface. The PMT interface, e.g., for a parallel module test mode is coupled with a PMT control circuit that communicates with PMT pads. The control and DFT circuit is coupled with a MMR (memory management registers) interface and a MMR controller as a VBUS bus master. Power management is also provided.

Figure 2:
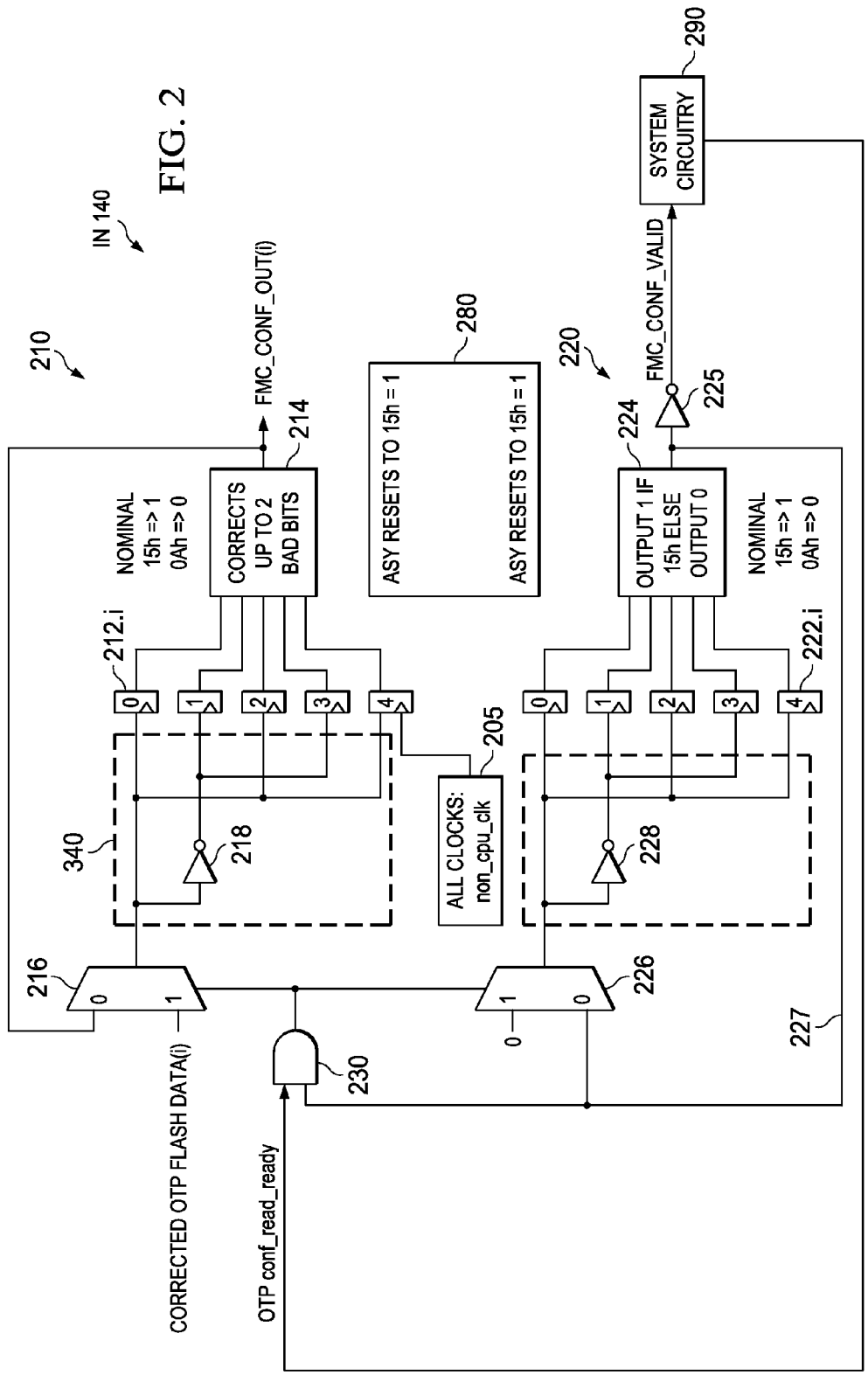
FIG. 2 is a partially-schematic, partially block diagram of one kind of an error-resistant configuration/control circuit embodiment, which illustration depicts a structure embodiment and/or a process embodiment.

In FIG. 2, a pair of circuits 210 and 220 are responsive to a first input designated Corrected_OTP_Flash Data(i) for a configuration data line or control data line to be specially protected, and a second line designated OTP_Conf_Read_Ready that provides a ready signal that is active when an OTP 115 configuration data read is ready. The circuitry 210, 220 is replicated for each such configuration/control data line to be protected. Each circuit 210, 220 is structured similarly but not identically in this example, and the enumeration 21x and 22x corresponds with respectively analogous components. Accordingly, circuit 210 is described in detail and the description of circuit 220 is shortened for conciseness. Circuits 210 and 220 share or are fed by a clock non_cpu_clk 205. In circuit 210, a five bit register 212 has flops 212.i that supply outputs nominally representing 15h (15 hex=10101 binary) or 0Ah (0A hex=01010 binary) to a decoding and error correction block 214 that corrects up to two (2) erroneous bits departing from either of those two values 15h or 0Ah. The original binary value Corrected_OTP_Flash Data(i) that is reproduced on decode by error correction block 214 is zero (0) or one (1), and the five bit code 15h corresponds to that binary one (1) while the alternative five bit code 0Ah responds to that binary zero (0). Decoding and error correction block 214 recovers the originally OTP-stored single bit value supplied by Corrected_OTP_Flash Data(i) from the 5-bit coded representation of that value and is successful even if that 5-bit coded value has become subject to one or even two errors. The recovered binary value is supplied as a flash module controller configuration output signal FMC_CONF_OUT(i) and that value is maintained with high error-resistance despite noise, interference, alpha-particle errors and other sources of error.

Continuing with the description of circuit 210, that value of FMC_CONF_OUT(i) is fed back to a first input "0" of mux 216 that is coupled to the mux 216 output line when the mux 216 selector signal has a low state, i.e. "0". The input line for the signal Corrected_OTP_Flash Data(i) goes to a second input "1" of mux 216 that is coupled to the mux 216 output line when the mux 216 selector signal has a high state, i.e. "1". The signal level in the output line of mux 216 is encoded into five bits by connecting that output line of mux 216 directly to the first, third, and fifth flops 212.1, 212.3, 212.5 in the register 212.i. A logical inverter 218 couples that output line of mux 216 with inversion to the second and fourth flops 212.2 and 212.4. That way when the output line of mux 216 is a logic low, an encoded value 01010 (0Ah) is stored in register 212.i; and if a logic high from mux 216 then an encoded value 10101 (15h) is instead stored in register 212.i.

Further in FIG. 2, and by contrast with circuit 210, the circuit 220 output is inverted by a logical inverter 225 to deliver a configuration-valid high-active output designated FMC_CONF_VALID. Also, mux 226 is supplied with a hardwired low (0) representing a Valid state to its second mux input "1" instead of OTP data as with mux 216.

Asynchronous reset (asy reset) resets each of registers 212.i and 222.i to 15h (10101 binary) via reset circuitry 280. In circuit 220 operation, decoding circuit 224 delivers an output one '1' in response to the 15h reset value. That output one '1' from circuit 224 goes to input zero '0' of mux 226 and also qualifies or enables AND-gate 230. Inverter 225 responds to that output one '1' from circuit 224 with a low, inactive output signal FMC_CONF_VALID indicating to system circuitry 290 that the configuration is not yet valid. While in this condition, mux 226 input "0" passes that output one '1' from circuit 224 to encode circuit 228 that delivers 15h (10101) to register 222.i on each clock and thus holds the value 15h in place. When enough time has elapsed for OTP flash data to settle on the line Corrected_OTP_Flash_Data(i), system circuitry 290 activates the signal OTP Conf_Read_Ready to already-qualified AND-gate 230. Accordingly, AND-gate 230 output drives the selector inputs of muxes 216 and 226 high (1). Now the selector input of mux 226 is high (1), and the hardwired low (0) at input '1' of mux 226 is encoded by encode circuit 228 into 01010 (0Ah) and stored in register 222.i instead of the earlier 10101 (15h). Decoding and error correction circuit 224 decodes the value 01010 (0Ah) into an output low and delivers that low (0) state to the input "0" of mux 226 and to a first input of the AND-gate 230 and disqualifies AND-gate 230 via that first input. Concurrently, inverter 225 responds to that output low (0) from circuit 224 with a high state of signal FMC_CONF_VALID indicating to system circuitry 290 that the configuration is valid. The second input of that AND-gate 230 is fed by the line OTP_Conf_Read_Ready. The output of disqualified AND-gate 230 goes low because it is disqualified, causing whatever logic state at input "0" of each mux 216 and 226 to be passed through to its respective mux output. Mux 226 input "0" passes that output low (zero, 0) from circuit 224 to encode circuit 228, which in turn delivers 0Ah (01010) to register 222.i on each clock and thus holds the value 0Ah in place.

Thus the AND gate 230 protects the circuitry 210, 220 from update unless FMC_CONF_VALID is FALSE and OTP Conf_Read_Ready is TRUE. A change to either one such state does not reload the configuration. The connection through the system circuitry 290 may force OTP Conf_Read_Ready active in due course when FMC_CONF_VALID is FALSE, but OTP Conf_Read_Ready alone does not force FMC_CONF_VALID. System circuitry 290 responds to the FMC_CONF_VALID low, if one is generated by circuits 224, 225, such as by initiating an OTP memory access for configuration/control data to refresh each such circuitry 210, 220 of FIG. 2 in BUS2Inf 140. Alternatively, the system circuitry can respond to the FMC_CONF_VALID low (False) by performing a reset as in FIG. 7 for the entire system (e.g. in FIG. 4) that includes such an OTP memory access for configuration/control data to refresh each such circuitry of FIG. 2 in BUS2Intf 140. Either way, such OTP memory access is signaled to AND-gate 230 by an active high on OTP_Conf_Read_Ready. The output of AND-gate 230 goes high (1) and actuates the selector input of each mux 216 and 226 to mux the "1" input to its respective mux output. Accordingly, Corrected_OTP_Flash Data(i) has its configuration/control logic state value encoded and delivered to register 212.i in circuit 210. Correspondingly in circuit 220, the hardwired low (0) at the "1" input of mux at 226 is encoded and delivered to refresh the register 222.i, whereupon decoding and error correction circuit 224 changes its output back to low (0) and disqualifies AND-gate 230. Concurrently the inverter 225 restores the configuration-valid high (1) output on the line FMC_CONF_VALID and thereby signals that the system configuration as to at least the protected configuration/control signals is restored.

Note that the FIG. 2 circuitry 220 can also be arranged in an alternative embodiment to have a different decoding circuit between mux 226 and register 222 such as to establish or verify a hardwired distinct multi-bit key of any pre-specified value, instead of the legended encoding parallel to that of circuit 210. Any error in such key can drive the FMC_CONF_VALID inactive.

The way circuit 224 is shown in FIG. 2 is that if all five bits are flipped through error from an active 0Ah state to a 15h state, inverter 225 will turn off FMC_CONF_VALID, and this is very unlikely to occur. Where persistence of the valid state is desired, this is fine. In another embodiment version based on FIG. 2, refer again to the circuit 224 and inverter 225 that outputs FMC_CONF_VALID. Circuit 224 in this alternative version has different circuitry that corresponds to a revised legend here stated as 'output 0 if 0Ah else output 1'. This way, any bit change in register 222.i off the active 0Ah (01010) state will cause circuit 224 to output a one '1' which causes FMC_CONF_VALID to be '0' and turn off or reset the circuit or actuate a new OTP read. In FIG. 2, suppose thus that at least one error occurs in the five bit register 222.i in this alternative version. Then the output state of decoding and error correction block 224 goes high (instead of corresponding to the hardwired low) and qualifies AND-gate 230 at the first input thereof. Also, inverter 225 forces output FMC_CONF_VALID low to represent an invalid configuration state, thereby acting as a warning protectively. In another alternative version, block 224 is identical to block 214 and both correct up to a plural number (e.g. two) bad bits. Various other circuit variations can be provided as to employment or not of various logic circuits and connections.

In some of these alternative embodiment versions, FIG. 2 circuitry 220 operates so that any error in circuit 220 that forces FMC_CONF_VALID low is most likely more frequent than, or may even be contemporaneous with, an error happening in circuit 210 as well. That way, a sensitivity is embedded in circuit 220 to even more fully ensure that circuit 210 is refreshed in case of error in circuit 210 or 220. Circuit 220 thus acts as a non-intrusive error monitoring circuit or proxy for circuit 210 and thereby protects whatever configuration bit value, such as that of endianess, may be represented in circuit 210. Circuit 220 is provided as a sensitive monitor of interference and alpha particles, analogous to a canary in a mine (i.e., the canary is more sensitive to dangerous conditions than a human and so the canary is a safety-promoting proxy). In some other embodiments, circuit 220 might be made sensitive to provide FMC_CONF_VALID low if at least two errors occur, while circuit 210 is made resistant to as many as two errors.

Figure 3:
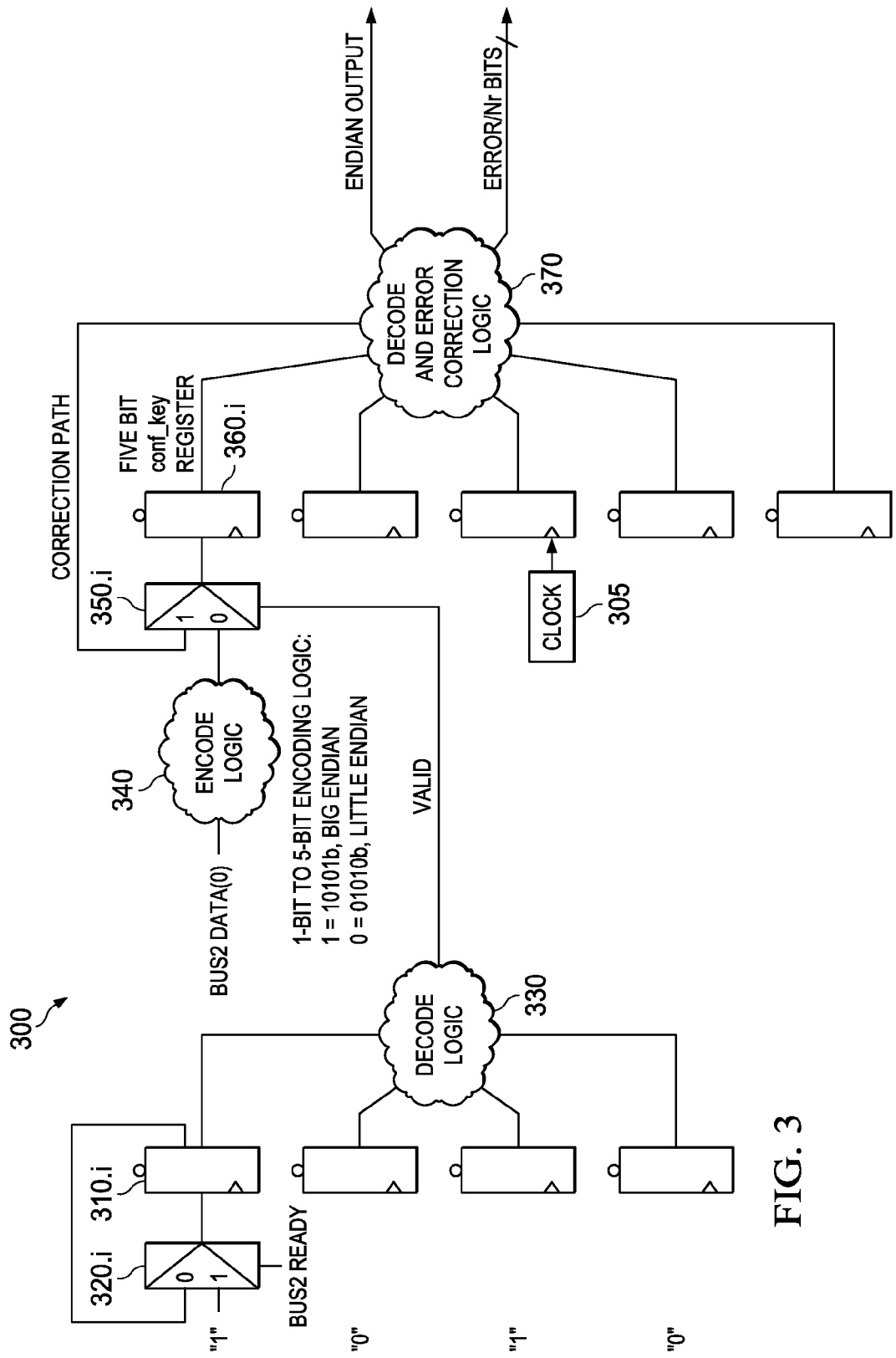
FIG. 3 is a partially-schematic, partially block diagram of another error-resistant configuration/control circuit embodiment for endianess, which illustration depicts a structure embodiment and/or a process embodiment.

In FIG. 3, endianess selection is made via sampling of a one-time programmable OTP configuration memory 115, such as on power up or system reset. The circuitry 300 of FIG. 3 represents an additional type of embodiment for handling a configuration/control signal in a way with high resistance to errors, and using a specific example of an endianess configuration bit to be protected and distributed around a SoC, e.g. of FIG. 4. The configuration memory 115 of FIG. 1 is suitably programmed by the manufacturer or authorized person. A Valid_Key register 310 has each register bit flip-flop 310.i fed by a respective multiplexer (mux) 320.*i* that is similarly provided for each of these register bits 310.*i*. Muxes 320.*i* have their selector inputs fed by a same BUS2Ready line. A multi-bit binary key value (e.g., "1010" bits vertically distributed at left in FIG. 3) is passed by muxes 320.*i* to update Valid_Key register 310.*i* when BUS2Ready is active (e.g., high, one (1)). Otherwise, muxes 320.*i* re-input the current contents of the flip-flops 310.*i* into themselves 310.*i* respectively when the register flip-flops 310.*i* are clocked by a shared clock 305.

The FIG. 3 circuitry provides a mechanism to restrict spurious changes from spurious software writes. A first decode logic 330 provides a Valid signal output when a valid value is present in the Valid_Key register 310. An encoding logic 340 is fed by a BUS2Data(0) line and provides 1-bit to 5-bit encoding logic that outputs 10101 binary to represent big endian when BUS2 Data(0) is active one (1) and otherwise outputs 01010 binary to represent little endian when BUS2 Data(0) is inactive zero (0). Each of five further muxes 350.*i* has a first input "0" fed by a respective bit in the 5-bits output of encoding logic 340. The selector output of each mux 350.*i* is fed by the state of the Valid output line from the first decode logic 330.

When Valid is active from first decode logic 330, the muxes 350.*i* pass the five-bit code for big endian or little endian code output from encoding logic 340 via muxes 350.*i* outputs to a five-bit Conf_Key register 360.*i*. A decode and correction logic 370 provides a second decode logic in FIG. 3, and it has a five-bit input fed by the Conf_Key register flip-flops 360.*i* respectively. Second decode logic 370 has a first single-line output that delivers an Endian Output signal to controlled circuitry of FIG. 4. Decode and correction logic 370 has a second output Correction_Path that includes five lines that respectively are fed to a second input of each corresponding mux 350.*i*. That way, when Valid is inactive from first decode logic 330, the decoding logic and correction logic 370 via each mux 350.*i* keeps the five-bit Conf_Key register 360.*i* value correctly maintained over intervals of time in which that value might become otherwise unexpectedly or undesirably altered. Using the multiple-lines Correction_Path also facilitates error-resistance of the circuitry of FIG. 3. Note that the correction path is shown for one register bit only to improve clarity of FIG. 3, but is provided analogously for each bit flip-flop 360.*i* of Conf_Key register 360. The register flip-flops 360.*i* are all clocked by shared clock 305 for periodic updating via the muxes 350.*i*.

Until a valid key value is presented to first decode logic 330 via the Valid_Key register 310, the Valid output from first decode logic 330 remains inactive (shown as high, one (1)). This prevents spurious writes from interfering with the rest of the FIG. 3 circuitry. When a valid key value (see illustrated predetermined value "1010" binary read downward) is presented to first decode logic 330 via the Valid_Key register 310, the Valid output from first decode logic 330 becomes active (shown as low, zero, VALID=0). Otherwise, VALID=1 is generated by the decode logic 330 when the bit contents of Valid_Key register 310 are in any other combination other than, e.g., "1010". In the active case of VALID=0, the endian code output from encoding logic 340 responsive to the current BUS2 Data(0) value is then used to update Conf_Key register 360.*i* such as for changing the endian status from little to big, or vice versa. Then that five-bit endian status value or code remains in the Conf_Key register 360 until a further change becomes validly made via BUS2data at some time in the future.

Figure 4:
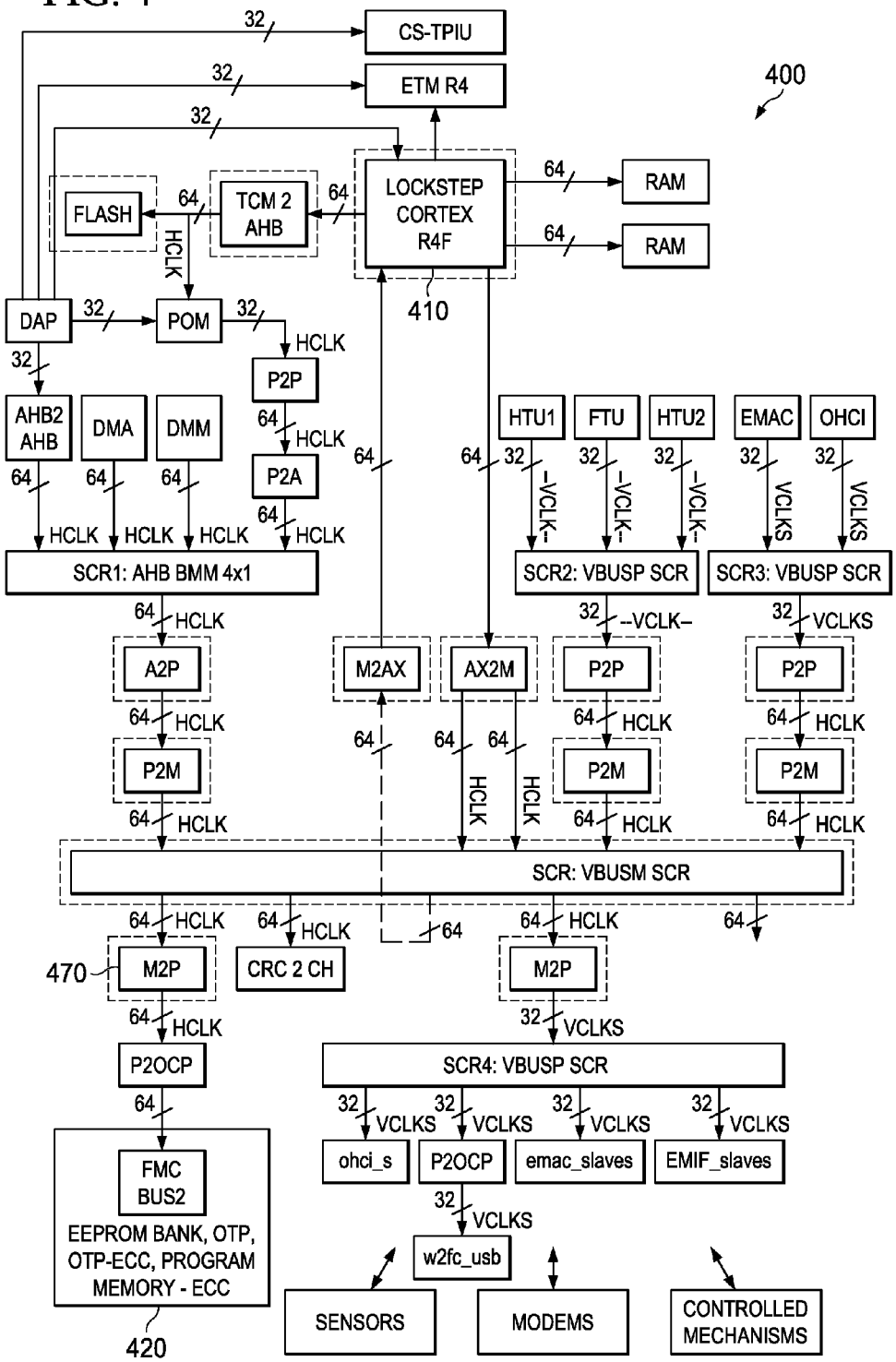
FIG. 4 is a system-on-chip (SoC) block diagram improved with circuits, devices, processes and systems of the other Figures and provided with controlled sensors, modems and actuatable mechanisms.

In FIGS. 3 and 4, elements which establish or change endianess are made responsive to the configuration. In FIG. 4, many of the blocks used in a SoC (System on Chip) 400 can support different endianess or types of bit ordering depending on status of a control signal. Endian Output in one example embodiment is a single line signal (FIG. 3) to command these blocks to little Endian or big Endian mode. That single line signal Endian_Output is fanned out to all modules, such as those circled on the SoC 400 device of FIG. 4, that are to be controlled for endianess.

Figure 3A:
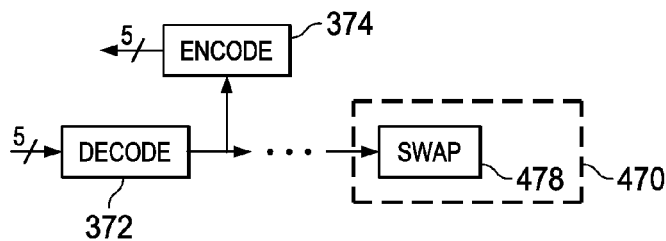
FIG. 3A is a block diagram detailing decode and error correction logic embodiment for FIG. 3 with an interface block for FIG. 4.

In FIG. 3A, a decode and error correction logic embodiment for FIG. 3 has a decode circuit 372 that supplies the single-line Endian_Output. The Endian_Output goes to a 1-to-5 encode block 374 that supplies each of the five lines Correction_Path in FIG. 3. An interface block 470 for many circled places in FIG. 4 includes a swap circuit 478 responsive to the single-line Endian_Output of FIGS. 3 and a 3A. In general, swap circuit 478 effectuates the type of bit ordering called for by Endian_Output.

Figure 3B:
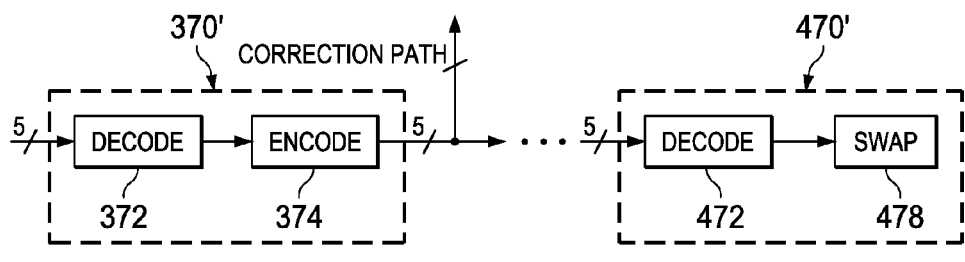
FIG. 3B is a block diagram detailing an alternative arrangement for the decode and error correction logic embodiment and with decoding in an alternative interface block for FIG. 4.

FIG. 3B details an alternative arrangement for a decode and error correction logic embodiment 370' (370-prime) for FIG. 3 and with a decoder 472 in an alternative interface block 470' for FIG. 4. Using this alternative arrangement, some embodiments route the multiple lines of Correction_Path of FIG. 3 to carry an encoded endian output in FIG. 3B that is decoded by decoder 472 in each interface block 470' to be controlled for bit ordering in the SoC of FIG. 4. Decoder 472 is similar to decoder 372 so that a given endian bit is decoded even if one or two errors have been introduced on the way between encoder 374 and decoder 472.

Returning to FIG. 3, the circuitry of the decoding and error correction logic 370 that generates Endian Output is detailed next. If, for example, as many as any two out of the five bits in register 360 become corrupted, then the decoding and correction logic 370 corrects them and concurrently outputs the correct single bit value representing the current endianess. Decoding and correction logic 370 is implemented for such error corrections by associating each of the two five-bit endianess codes with corresponding nonoverlapping sets of 16 codes (Sum of the number of combinations of five taken zero, one and two errors at a time). The 16 codes in a given one of the sets represent one way of starting with a correct code e.g. 10101 (or 01010) and ending up with no error, five one-bit errors or ten two-bit errors. The decoding part 372 of the logic 370 outputs a binary zero (0) or binary one (1) as decode output depending on which of the two sets of 16 codes the current value of in Conf_Key register 360 corresponds or is a member.

The correction part of the logic 370 can implement encoder 374 like encoder 340 (see also dotted-line circuit 340 in FIG. 2). Another way to implement encoder 374 provides e.g. a mux that has a selector line fed with the binary zero or binary one decode output. That encoder mux outputs whichever of two hard-wired 5-bit input values 10101 (or 01010) corresponds to the correct code for the endianess thus decoded and that corresponds to the single-bit decode output. Decoding and correction logic 370 can be provided as a small 32-value associative memory for decode followed by an output encoding mux, or can be alternatively provided as optimized 5-bit logic or any other suitable way to accomplish the same overall decoding and error correction taught here. As few as about eleven 2-input gates may be sufficient to generate the binary Endian_Output of logic 370.

Conf_Key register 360 can be lengthened and provided with longer multi-bit endianess codes (six or more bits). (For seven (7) register bits when using 1010101 and 0101010 as endiannness codes, there exist 64 correctable possibilities: 1 correct+7 single-bit errors+7×6/2 two-bit errors+7×6×5/(3×2) three-bit errors, which is half of 128=$2^7$.) More extensive error decoding and correction logic 370 is correspondingly provided if it is desired to correct up to three or even more errors in Conf_Key register 360. Conversely, less-extensive but useful error decoding and correction logic 370 is correspondingly provided to detect endianess and correct up to one error with as few as three register bits in Conf_Key register 360. (1 correct+3 single-bit errors=4, which is half of $8=2^3$ for three register bits when using 101 and 010 as endiannness codes.) In general, the error correction is effective to correct errors in the register equal to as many as a first integer m less than half the number of bits in the register.

Using the concept of Hamming distance provides another way of understanding and providing the decoding and error correction logic for any of FIG. 2 blocks 214 or 224, or FIG. 3 block 370. When comparing two multibit codes the Hamming distance d is equal to the number of different (i.e., differing) bit values in corresponding bit positions. An N-bit code A and its logical complement !A differ in all N bit positions so their Hamming distance is d=N. In FIGS. 2 and 3, the multibit codes A and !A (i.e., Not-A) are conveniently used to represent single bit configuration values 0 and 1. Any other code value E, such as a code value A that has been affected by error(s) in register 212.*i* or 222.*i*, or error(s) in Conf_Key register 360.*i*, has some Hamming distance d(A, E) equal to some number from 0 to N away from the correct code value A itself. The Hamming distance d is also the same as whatever number d of bits in code value A have been altered by errors. Since the actual code value that was established in response to an original configuration/control line signal might be either A or !A, the embodiments recognize that the Hamming distance could be either d or N-d. Since the probability that fewer errors occurred is significantly greater than the probability that more errors occurred, the true Hamming distance is inferred to be the lesser of d or N-d. Another way of expressing it is:

$$d=\text{MIN}[d(A,E),d(!A,E)] \quad (1)$$

Let the multibit code A represent a configuration value of logic level zero (0), and let its bit-by-bit complement !A represent logic level one (1). The decode and error correcting logic in some embodiments is correspondingly set up to deliver a value C on the Endian_Output path such as by using the unit step function u[ ] as follows:

$$C=u[d(A,E)-d(!A,E)] \quad (2)$$

In words, Equation (2) represents an electronic operational process embodiment that determines the Hamming distance between the actual multibit value E in the Conf_Key register and the multibit encoded value A for logic level zero (0) and then subtracts the Hamming distance between the actual multibit value E in the Conf_Key register and the multibit encoded value !A for logic level zero (1). If the result of the subtraction is negative (<0), the Hamming distance of E from A is less than from !A, and the correction value of C=0 is provided as Endian_Output and is fed back encoded as A to update the Conf_Key register 360. If the result of the subtraction is positive instead, the correction value C=1 is provided as Endian_Output and is fed back encoded as !A (Not-A) to the Conf_Key register 360 because the Hamming distance from E to !A is the lesser Hamming distance. This operation delivers the correction value C using the unit step function u[ ] that is 0 when its argument is negative and is one (1) when its argument is positive. The correction value C is determined without ambiguity when the number N of bits held by the Conf_Key register is an odd number, because the difference between number d and the number N-d is then never zero.

Note also that the particular bit values for the N-bit multibit code 'A' may be arbitrarily selected and that the particular multibit value A=01010 that is used in the number of the examples herein could be replaced by any of the 32 possible five bit values. Then the other multibit code !A is the logical complement of whatever the multibit value is selected for A. (If the type of circuit or layout used in register flop 360.*i* is systematically more susceptible to error if its state is 0 (zero) rather than 1 (one) and if one of the endianess types will be used far more than the other, then a multibit value A can be established that has more ones (i.e. the less error-susceptible state) than zeroes in the multibit value A for the most-used endianess type.) As noted elsewhere herein, the number N of bits need not be five (5) but could be instead made more or fewer depending on the largest number of bits of error correction that are desired. A multibit Conf_Key register with a number N of bits can support a largest number of bits of error correction equal to the first integer less than N/2.

Decode and error correction logic 370 of FIG. 3, or its counterparts in FIG. 2, are suitably set up in one type of embodiment so that a set of N exclusive-or (XOR) gates bitwise compare the bits in predetermined multibit value A and the actual value E in Conf_Key register 360.*i*. Inverters on the outputs of the XOR gates efficiently supply the comparison bits as between !A and E. Two hardware summers fed by the XOR gates or by the inverters provide the Hamming distances. A subsequent subtractor subtracts the Hamming distances and the sign bit therefrom provides the correction value C as the FIG. 2 output FMC_CONF_OUT(i).

Some embodiments as in FIG. 3 put a replica of Encode logic 340 inside of Decode and error correction logic 370 to make encoder 374 feed back the multibit code to inputs "1" of muxes 350.*i*. Some other embodiments as in FIG. 2 use or put a single Encode logic 340 shown dashed in FIG. 2 instead of, and omitting, the afterwards-encode 374 circuit seen in FIG. 3A. Then Encode logic 340 provides its multibit outputs to the Conf_Key register flops 360.*i* respectively without having muxes 350.*i* intermediate between logic 340 and flops 360.*i*.

In FIG. 3, the output lines Error/Nr_Bits are provided with signals as represented by the following hardware design pseudocode (3) and (4). In some embodiments such hardware in circuit 370 and these output lines Error/Nr_Bits support error monitoring, and/or debug, and/or error-resistant system response. They may also be regarded as providing a 'canary in a mine' function that is built into circuitry 300 itself.

$$\text{Nr\_Bits}=\text{MIN}[d(A,E),d(!A,E)] \quad (3)$$

$$\text{IF (Nr\_Bits>0) THEN Error=1 ELSE Error=0} \quad (4)$$

The number N is likely to be selected as an odd number in many embodiments, although some embodiments are feasible wherein the number N could be even (2, 4, 6, or more). The reason for this feasibility is based on physical considerations and register clocking rate in the circuitry. In many actual applications, the rate of occurrence of interference, noise peaks, or the rate of alpha particle collisions varies over time during which at least several, if not a quite large number, of register 212 (or 360) clock cycles would occur from clock 205 (305). In many applications, even one error in FIG. 2 or FIG. 3 almost never occurs and providing for e.g. two correctable errors is one-extra for good measure. Also, the flops 212.*i* and the flops 222.*i* can be physically situated at a moderate distance from one another on a chip layout to reduce to negligibility the likelihood of, e.g., a single alpha particle toggling more than one flop at ordinarily-expected peak alpha particle flux. However, in some unusual or very demanding applications, the interference or alpha particle flux could call for even more attention as discussed next. Accordingly, if a significantly large number of errors might occur sometime, the number of errors that might be occurring (and having to be corrected) in the Conf_Key register 360 between consecutive register clocks a little while beforehand is quite likely to start increasing. (The register clocking is somewhat analogous to 'windshield wipers' acting to improve visibility, and an appropriate rate or increased rate can help especially in those unusual applications wherein the interference or alpha particle flux engenders a significant error rate or incidence, and the register clock rate is less than high enough to keep the flop-toggling errors essentially zero at the highest correctable number e.g. two bad bits or otherwise as measured for a highest correctable number m in a statistical error-numbers measurement binning process.) Some embodiments therefore are contemplated that have circuitry like block 750 of FIG. 7 to maintain at least some recent history of errors detected by the decode and error correction logic 370. If the errors start trending upward or increasing, then one or more of the following measures in a suitably applied: 1) increase the clock rate from clock 305 for updating Conf_Key register 360 whereby it is corrected more frequently, 2) power up or activate auxiliary circuitry to increase the number N of coding bits and the active gates in the complexity of the decode and error correction logic 370 to support the increased number N, 3) warm reset, 4) other suitable means. Any of these measures also represents a form of error circuit remediation 740. Also, that way, either an odd number N or an even number N, or both odd and even at different times, are supported in various error-resistant embodiments.

Also, providing Conf_Key register 360 with an even number N of bits can be useful in contemplated embodiments that can trigger a warm reset when exactly N/2 errors are detected. Since the presence of N/2 errors is an error level that represents uncertainty as to whether error correction is capable of recovering the original configuration value(s), warm reset is an appropriate measure to access the OTP stored value(s) and recover the correct configuration/controls. In some embodiments for a configuration bit, such as an endianess bit, a warm reset does not trigger the reload so in that type of embodiment this remediation is omitted or performed by hard reset. In embodiments where a reset does trigger reload of a pertinent configuration bit, such error-actuated remediation using a reset can be feasible.

Note further that a rate for clocking the correct multi-bit endianess can be established in FIGS. 2 and 3 to achieve a desired very-low probability of errors in Conf_Key register 360. Some more sophisticated embodiments can dynamically increase the rate for clocking Conf_Key register 360 if occurrences of errors in Conf_Key register 360 are more frequent than expected. In such embodiments, the existence of an error is detected by using, e.g., two sets of five one-bit comparators collectively fed with the contents of Conf_Key register 360 and the correct codes (01010 and 10101). Logic analyzes the comparator output and feeds one or more statistics counters that are periodically reset by the register clock. Threshold logic increases the register clock frequency for Conf_Key register 360 if a statistics counter counts a number of errors that exceeds the threshold.

Status registers or statistics registers are suitably provided to log errors unconditionally, or under only certain operating conditions, or otherwise as desired. Error enables are suitably configured to provide different types of conditional logging of errors. For one example, single bit error correction or better (more errors corrected) is performed on reads to OTP for reset configuration. Single bit error enables are deactivated on reset if it is desired that no errors be logged into the status registers. Multi-bit errors are suitably logged and a module-based error signal is suitably output if a bit (e.g., designate it ECC_Re-set_Config) is active. Error correction by logic 370 may also be operated in modes that specify No_Correction, or Error_Correction to a specified number of erroneous Conf_Key register 360 bits, e.g. up to 1, 2, 3, etc. errors.

FIG. 3 details endianess control circuit 300 situated in FIG. 1 bus interface block Bus2inf. Tie-off value "1010" in FIG. 3 is hardwired or can be established by e-fuses instead. Bus control signal Bus2Ready is, e.g., under FIG. 1 flash module controller FMC module control and is activated at Reset time. An access to Bus2 raises that bus control signal Bus2Ready at system Reset and at other times. When Bus2Ready goes active at the muxes 320.*i* at left, signifying Bus2 is active, then Bus2Ready also shuts off the VALID_Key register logic and Valid is zero (0, low-active). At such time and thereafter when VALID=0, the valid signal acts as a selector or enable and causes muxes 350.*i* to admit or pass an endian code from encode logic 340 responsive to BUS2data(0) so that a predetermined bus data endian code goes into the Conf_Key register 360.*i* to signify the big endian or little endian operation to be established in the system of FIG. 4.

In FIGS. 1 and 2 or 3, a sequence for configuring endianess is executed after system power up of the SoC and flash module 100 of FIG. 1 becomes active. The flash wrapper 120 counts a predetermined sufficient number of clock cycles after the flash 100 becomes active, and then outputs the contents of the OTP memory 115 that control the device endianess and power domain states and any other desired configuration. A Config_Valid signal goes active, and CPU reset is released one or more clock cycles after that so that each CPU can begin code execution, e.g. as in FIGS. 4 and 5.

In FIG. 4, all of the blocks identified with a red circle support multiple endianess and are controlled to support Little Endian or Big Endian at device level. In general, the CPU(s) 410, flash module 100 or 420, and key elements of the bus interconnect between CPU/memory/peripherals are controlled for endianess.

In FIG. 4, one or more endian control lines such as FMC_CONF_OUT(i) from FIG. 2, or the Endian_Output line from FIGS. 3 and 3A, or the multibit line of FIG. 3B, go to the target modules like 470 of FIG. 4. Most of the target modules are set up to default to run on a particular configured default endian (e.g., Little Endian). Other ones of the target modules are suitably arranged to be byte, word, or double-word invariant Big Endian and swap bytes/words/double words as needed depending on the state of their control signals. See, e.g., the swizzle circuits and control registers in FIG. 6 regarding endian control.

In FIG. 4, SCR is a switched central resource, also known as a crossbar switch or bus matrix logic which arbitrates bus master access, decodes access to specific slaves, and routes transactions.

In FIG. 4, a flash module and flash wrapper circuit of FIG. 1 are coupled to include an extra ECC engine in the flash wrapper on OTP (one-time programmable memory) implicit read that does error correction before storing a configuration datum Corrected_OTP_Flash_Data(i) in the self-correcting flop structure, e.g. of FIG. 2.

Testing of the read mechanism is accomplished by a software test of endianess that is provided in some embodiments. The software/firmware approach is useful alone or in combination if the circuitry is such that a hardware failure would establish wrong endianess and prevent a successful boot, or trigger other fails (i.e., failure determinations). Automatic hardware read could be provided in some other embodiments using hardware-only circuitry.

Figure 5:
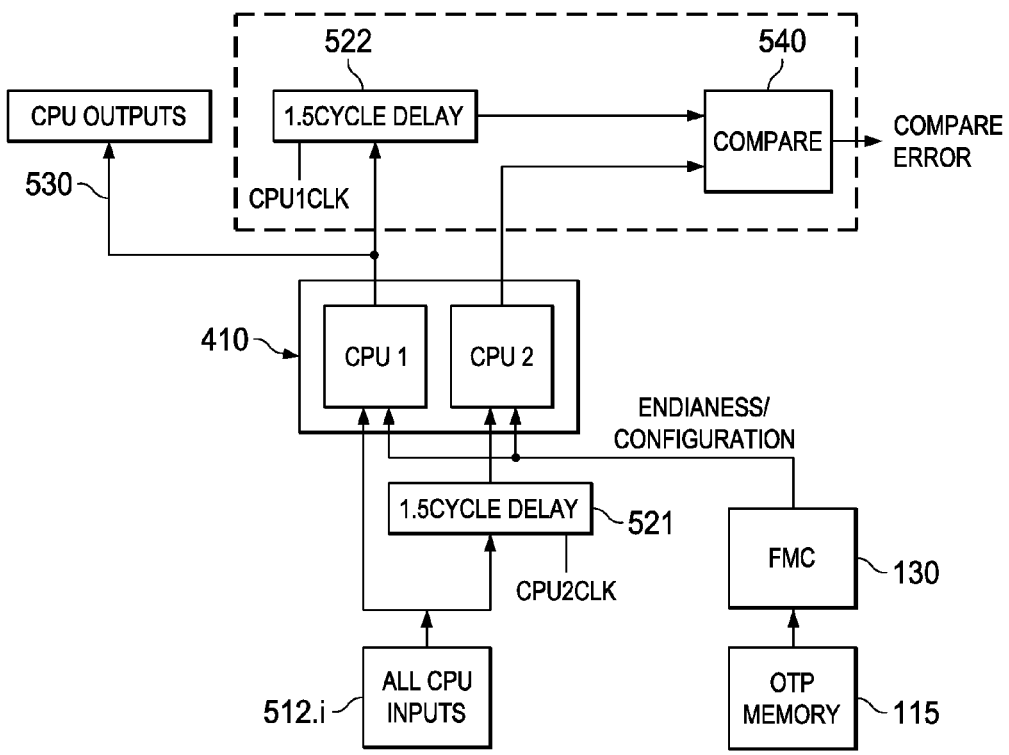
FIG. 5 is a block diagram of a dual lock-step CPU system embodiment for use with the circuits, devices, processes and systems of the other Figures.

Endianess status can be read by the software in both CPUs of FIG. 5 and from the original configuration memory in flash 100 as a runtime diagnostic. The system embodiment has two lock-step CPUs, CPU1 and CPU2, see FIG. 5.

Figure 6:
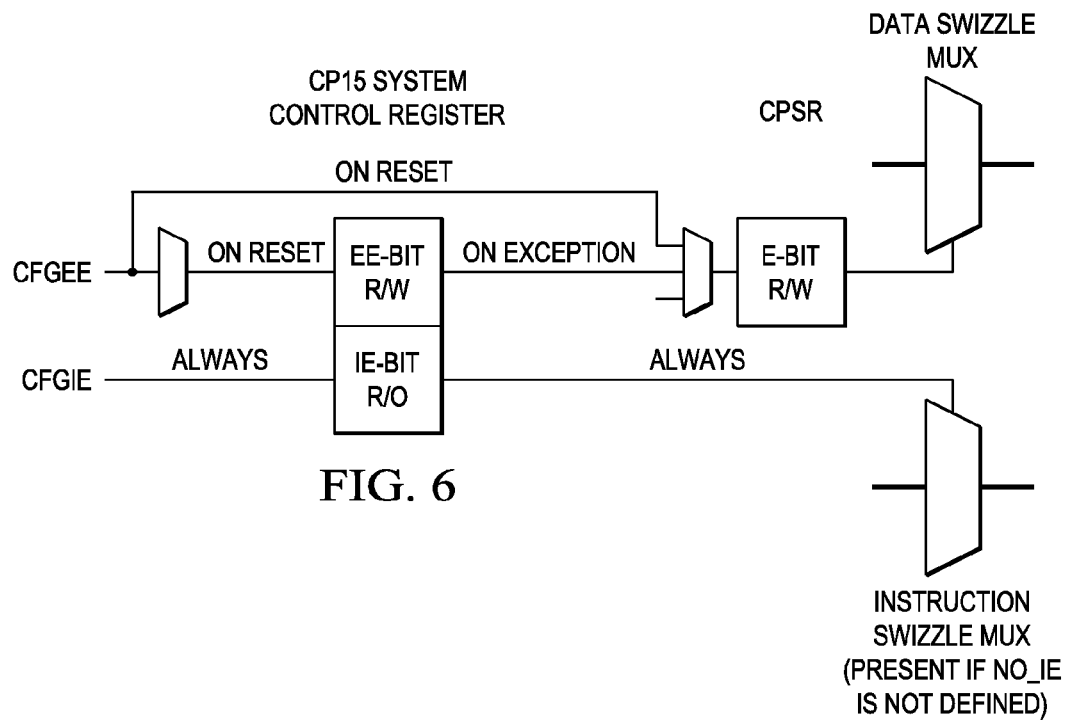
FIG. 6 is a schematic diagram of an endian control circuit for a processor CPU.

A runtime automatic electronic diagnostic process for the endianess status is enumerated next:
1) Read the OTP memory endianess contents (See e.g. FIGS. 2 and 5.)
2) Check any endianess configuration registers provided in the system of FIGS. 4 and 5 and including the CPU endianess circuit, e.g. of FIG. 6 CP15 control register.
3) Confirm correct endianess via on-chip electronic comparison test/debug circuit to show and verify presence or lack of endian control values that consistently represent and carry into effect the endianess called for by the OTP memory endianess contents.

The above diagnostic process is or can also be analogously executed for any other configuration bits that are being handled and implemented in the system as in FIGS. 4 and 5. This diagnostic process can be applied for FIGS. 1-5 in the field and is also useful in screening/test step 880 of FIG. 9 at manufacturing time.

The HW mechanism is suitably an ATPG (automated test pattern generator) engine doing or similar to one that would perform an implicit read from e-fuses. The HW mechanism suitably operates so that, if no autoload error is indicated and all error outputs from the FIG. 4 OTP control circuit are working correctly, the application initiates a self test on the SECDED ECC logic (single error detection and double errors detection, error correcting code).

For some background on SECDED ECC logic, see US Patent Application Publication 20110225475 dated Sep. 15, 2011, "A Low Overhead and Timing Improved Architecture for Performing Error Checking and Correction for Memories and Buses in System-On-Chips, and Other Circuits, Systems and Processes," which is hereby incorporated herein by reference. High performance ECC provides high throughput for partial writes exploiting locality in data traffic, and for pipelined ECC with pipeline-unaware CPUs. Some read embodiments enhance throughput by read bypass from a local write buffer to read output and also take advantage of locality in data traffic. An architecture that uses Hsiao codes realizes low area and low timing overhead encoders and decoders individually and in combinations. ECC is provided for memory and bus structures. A parity generator based on Hsiao code is placed at the source logic which drives the bus. Then a Hsiao code based ECC decoder is placed on the end part of the bus. The parity is sent in parallel to the decoder. The decoder checks for any errors which occur on the bus during data transmission due to issues like crosstalk, power supply droop, etc., that can also be corrected. In this case, no extra parity check bits, as for memories, are involved so that ECC for buses herein is low cost. Debug features are provided for silicon test. Periodic off-line testing and on-line testing are facilitated. Error logging capability is provided to give information about error locations, failing locations and types of failures.

This self test suitably uses boundary and pins registers of the module of FIG. 1. A self-test cycles register is configured to a desired number of self test cycles. A self test signature register is configured to a suitable signature value. A boundary register is configured to have a single one "1" at some intermediate bit in it. The configuration triggers a self test of the logic of FIG. 1 using a seed value of all ones, and is run at a test clock speed on the order of bus clock or processor clock. The application then polls a Self_Test_Done bit of a pins register of the module. An error during the self test is indicated by a self-test error signal output from the OTP control circuit or read from a self test error output bit from the module of FIG. 1.

An Endianess verification process for FIGS. 1-5 is listed as follows and is also useful in screening/test step 880 of FIG. 9.
1) Read the OTP memory contents
2) Compare with the states of the FIG. 6 endianess config registers in each CPU
3) Electronically confirm correct endianess, e.g. by test comparator output active.

In FIG. 5, a system with lockstep CPU cores uses a single core programmer's model. If either core picks or establishes a separate endianess different from the other core, then lockstep compare logic generates a fault signal.

Only CPU #1 drives the system. CPU #2 is a checker only. Endianess is one of a few configuration signals driven to both CPU cores without cycle diversity.

Endian selection from an embodiment like the circuit of FIG. 2 or FIG. 3 is fanned out to CPUs and other modules as in FIG. 4 or FIG. 5. In FIG. 5, endian selection to CPU2 is not delayed but most other inputs such as instructions and data are delayed by between 1 and 2 CPU cycles or about 1.5 cycles delay.

Three options or circuits are provided for glitch detection on the endian selection line. (For resisting extremely brief line-glitch transients, the input clock period is often ample and long enough for the CPU input circuits to settle without error. So the focus here is mostly on the remote scenario of a configuration flop-toggling error or an unusual glitch for which the options or circuits discussed next desirably provide detection and protection.) In a first such circuit, see FIG. 2, duplicate logic in some embodiments is used to generate respective Endian_Output signals that can be individually designated endian_select_1 and endian_select_2 and compared by a lock-step comparator circuit portion for a match. If any discrepancy between endian_select_1 and endian_select_2 is detected by the lock-step comparator circuit portion for comparing those two signals, an error signal is output therefrom and is suitably recorded as a first error code, counted for error statistics purposes, and/or used to actuate any one, some or all of even-more-intensive root-cause self-testing, failure-resistant measures, failure remediation, automatic-backup component substitution, graceful system wind-down, and/or a user warning.

In a second such circuit, see FIG. 3, the 5-bit Conf_Key decoding and correction logic of FIG. 3 is arranged to provide an Error output that indicates an occurrence of any error in the 5-bit Conf_Key register that is currently detected and/or being corrected by such logic. Also that logic is arranged to provide a Nr_Bits output indicating the number of bits (0, 1, 2, etc) that are currently being corrected by such logic. The Nr_Bits output is suitably provided by a lookup table LUT in such logic or by dedicated logic gates therein based on the description of the correction logic elsewhere herein. If any error or 2-bit error is detected by that FIG. 3 decoding and correction logic, the error signal and/or multiple-error Nr_Bits signal is output therefrom and suitably recorded as one or more second error codes, counted for error statistics purposes, and/or used to actuate any one, some or all of even-more-intensive root-cause self-testing, failure-resistant measures, failure remediation, automatic-backup component substitution, graceful system wind-down, and/or a user warning.

In a third such circuit, see FIG. 5, the 1.5 cycle delay 521 in FIG. 5 provided for most signals is omitted for the endianess signal at the endianess control inputs of CPU1 and CPU2 and omitted for any other configuration signals to which the same consideration applies. In FIG. 5, the circuit is organized or structured without relative delay to simultaneously use the same configuration or selection signal, e.g. Endian_Output of FIG. 2, to directly actuate both CPU1 and CPU2 in FIG. 5 substantially simultaneously. Then the thus-configured CPU1 and CPU2 execute operations based on data and instructions that are themselves delayed by block 521 in reaching CPU2 inputs. Conversely, the outputs of CPU1 and CPU2 are fed to respective first and second inputs of a lock-step comparator 540 in FIG. 5 with a 1.5 cycle delay 522 applied to the output of CPU1. The lock-step comparator 540 compares the comparator input signals, which should match on a cycle-by-cycle basis, for any discrepancy in the operations of CPU1 and CPU2. If any discrepancy is detected by the lock-step comparator 540, an error signal Compare_Error is output therefrom and is suitably recorded as an error code, counted for error statistics purposes, and/or used in FIG. 7 to actuate any one, some or all of even-more-intensive root-cause self-testing, failure-resistant measures, failure remediation, automatic-backup component substitution, graceful system wind-down, and/or a user warning.

In FIG. 5, an example of the comparator section 540 is based on a TMS570™ microcontroller environment (from Texas Instruments Inc., Dallas, Tex.) and has a comparator section designated CCM-R4. CCM-R4 comparator mode is controlled by a 4-bit test control register key field. In other embodiments based on other microprocessors, any other suitably effective comparator section is alternatively provided.

The flops shown in FIG. 2 or FIG. 3 are or can be implemented to support the endianess path and all other configuration/control paths or lines to be protected from errors. Buffers along the way (and without flops to avoid even low-probability glitching) suitably propagate the Endian_Output to all modules of FIG. 4 that can use this as input. The logic 370 is suitably implemented in combinational logic for further glitch resistance. In FIG. 3, soft errors are resisted or corrected by or in the multi-bit Valid_Key register 310 and Conf_Key register 360 and the associated circuitry. Decode and correction logic 370 prevents any glitches or temporary changes on the line Endian_Output by error-resistant decoding and furthermore corrects soft errors involving up to two bit flips in Conf_Key register 360. After that, if one of the lock-step CPUs of FIGS. 4 and 5 has any internal soft error, the CPU output compare circuit 540 for the two-CPU combination detects any such failure or soft error. Notice that the circuit embodiments of FIGS. 2 and 3 increase the stability and error-resistance of the line Endian_Output. This increases system performance in FIGS. 4-5 and FIG. 8 by reducing the number of times that CPU output compare circuit 540 is faced with a situation that causes it to issue an active Compare_Error output.

In FIGS. 4 and 5, the lock-step CPUs are beneficially kept in the same endian environment as the rest of the SoC device. The dual CPU comparison circuitry 540 detects any glitches or key alteration events on the endian selection line FMC_CONF_OUT(i) of FIG. 2 or Endian_Output of FIG. 3 for the following reason. By omitting or removing the 2-cycle delay elements 521 as to Endianess to the second processing unit, CPU2, the glitches or any key alteration event would intercept the two CPUs at different program execution points and show up as a compare_error from comparison circuitry 540. The interception at different program execution points is due to delay 521 retained for the instructions and data to CPU2 but absent for such input to CPU1. An endian glitch intercepts execution in CPU1 at a later program point than CPU2 because CPU1 is running a couple of instruction cycles farther ahead in the program than the delay 521-delayed CPU2 is running at any given instant. But the endian glitch, if any, reaches CPU1 and CPU2 substantially simultaneously since the glitch has no delay 521. Consequently, CPU1 and CPU2 will very likely produce different program outputs due to the differing effects of the endianness glitch on their program executions at least at the glitch-affected program instruction(s) or data. There, differing bit ordering would be induced by the glitch in circuits handling the CPU2 program execution relative to the CPU1 program execution at that same program point, which had actually been executed by CPU1 just before the glitch. Delay 522 on the CPU1 output brings the outputs from CPU1 and CPU2 corresponding to a same program point back into time-alignment. Compare circuit 540 then detects those differing effects of the endianess glitch on the same program point, and thereby the circuit 540 detects and eliminates common mode failures of which endianess glitch is a paradigm example. In the unlikely scenario where the glitch has no effect on either of the CPUs, the glitch event is then a silent effect that does not cause any harm, and need not be detected.

The Endian_Output bit of FIG. 3 provides controls if desired for both instruction endianess and data endianess in various controlled modules. Multiple endian circuits and output lines can be provided if desired to separately control instruction endianess and data endianess, or to separately control different endianess requirements for different modules. Where endianess is different in different modules but has a specific relationship to the endianess in other such modules, then simple logic controlled off a shared endian output configuration line from FIG. 2 or 3 can control them.

In FIG. 6, a flop inside each CPU registers the value of the endianess select line when CPU reset goes active. Alternatively, in some embodiments the e.g. 5-bit register 212 (360) and the 3-out-of-5 logic 214 (372) are instantiated per CPU, i.e. in each CPU, so that a glitch affects only one CPU out of two or more lock-step CPUs. Also, each CPU can have separate registers with bits for controlling endianess for instructions and endianess for data respectively. The endianess is controlled by applying the control bits to FIG. 6 swizzle logic that reverses the applicable bit order byte-wise, word-wise or double-word-wise or in any other suitable way for the purposes at hand to achieve the endianess to be established.

Figure 7:
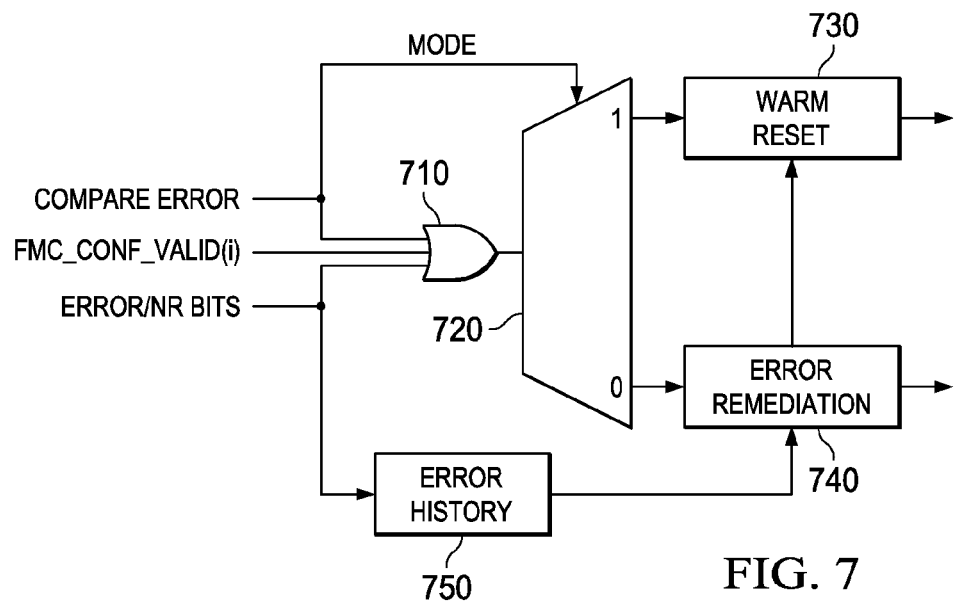
FIG. 7 is a partially-schematic, partially block diagram of an error-response circuit embodiment for use with the circuits, devices, processes and systems of the other Figures.

In FIG. 7, one example of an error-response circuit is depicted, without limitation. Any other suitable error-response circuitry such as other forms of logic to determine the error response are used alternatively based on the teachings herein. In embodiments that are introduced as improvements to pre-existing circuits, a circuitry for warm reset that may already be present can be modified and remarkably enhanced with additional input and control circuitry based on the teachings herein.

In FIG. 7, an OR-gate 710 is fed with lines that are high active when significantly problematic conditions exist in their circuits. Accordingly, OR-gate 710 has inputs fed with, or fed appropriately in response to, the Compare_Error line from FIG. 5, the FMC_CONF_VALID(i) line(s) from FIG. 2, the Error/Nr Bits lines from FIG. 3, and any other appropriate substantial-error indicating lines. If any of these lines go active, the output of OR-gate 710 goes high (active), at the input of a mux 720. In this example, the logic is set up so that activity on Compare_Error line from FIG. 5 calls for activation of warm reset block 730. Compare Error activity introduces a high (1) at the mode selector input of the mux 720. The high output of OR-gate 710 is passed by mux 720 to activate warm reset block 730, which in turn supplies reset controls to as many lines as needed to reset the SoC system, e.g., of FIGS. 4-5. On the other hand, if Compare_Error is inactive then mux 720 mode=0. Then if any activity occurs on the FMC_CONF_VALID(i) line(s) from FIG. 2, or the Error/Nr Bits lines from FIG. 3, then a first input of an error remediation circuit 740 is qualified. Concurrently, an error history circuit 750 is responsive to FIG. 3 Error/Nr Bits or to analogous error data from FIG. 2 to determine whether the error is sufficiently important or the Nr_Bits value is sufficient to activate a second input of error remediation circuit 740. Error remediation circuit 740 then activates output lines to effectuate any one or more of the error remediation measures described elsewhere herein. If necessary, error remediation circuit 740 may also activate warm reset block 730.

Faults or errors, if any, occurring at a microcontroller level are detected, resisted and/or corrected while or at the same time by its construction, the system embodiment supports dual endianess in the microcontroller, without compromising safety. As described, various embodiments can address safety matters and deliver safety-enhanced performance implementing dual endianess in systems and components intended for e.g. an ASIL-D compliant safety system. A combination of circuit and system constructs including microcontrollers, error-controlling logic blocks, and test procedures can be applied to meet and demonstrate compliance with safety requirements of ASIL-D and other safety standards. Levels of error-resistance and correction can be intelligently planned for and designed into products.

Some embodiments provide error-resistance for other types of orderings of bits, bit fields, nibbles, bytes, words, etc. Thus, little endian and big endian bit orderings are special cases. Also, designations of bit orderings can be stored in configuration memory as configuration codes of more than one bit and then encoded as described into still larger number of bits as taught herein for error correction and to promote safety of processing. Combination embodiments can have circuitries that are configured respectively or collectively for different bit orderings and made more fully secure and error resistant also.

Some embodiments are used with one or more microprocessors, each microprocessor having a pipeline is selected from the group consisting of 1) reduced instruction set computing (RISC), 2) digital signal processing (DSP), 3) complex instruction set computing (CISC), 4) superscalar, 5) skewed pipelines, 6) in-order, 7) out-of-order, 8) very long instruction word (VLIW), 9) single instruction multiple data (SIMD), 10) multiple instruction multiple data (MIMD), 11) multiple-core using any one or more of the foregoing, and 12) microcontroller pipelines, control peripherals, and other microcontrol blocks using any one or more of the foregoing. Some other embodiments lack a microprocessor.

Figure 8:
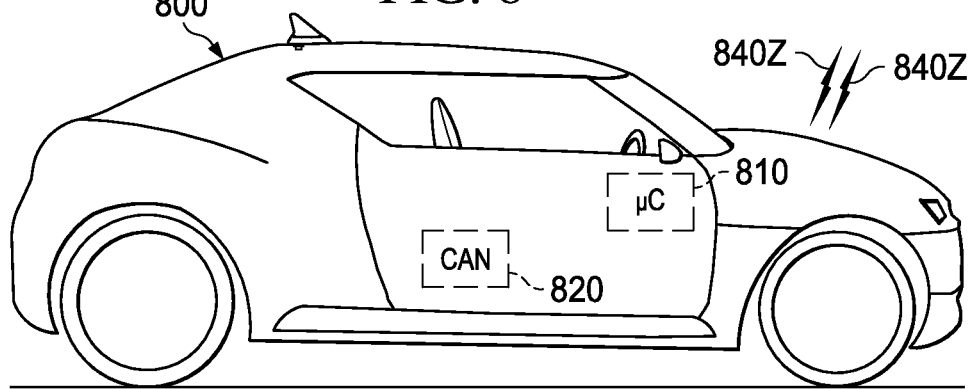
FIG. 8 is a partially-pictorial, partially-block diagram of a vehicle electronic system embodiment for increased configuration safety such as for endianess and as further detailed in the other Figures.

FIG. 8 shows a vehicle electronic system embodiment 800 for increased endianess safety as further detailed in the other Figures. A microcontroller IC 810 such as in FIG. 4 is part of a controller area network (CAN) 820 subject to disturbance or interference 840Z from ignition system voltages, engine operations, tire static, etc. As detailed in the other Figures, the configuration embodiments, such as for endianess, can cooperate and perform even more reliably with CAN 820 circuitry such as I/O, Vss, vehicle ground GND, and control lines to various automotive subsystems that are coupled and associated with microprocessor 810.

Various SoC or IC embodiments are implemented in any integrated circuit manufacturing process such as different types of CMOS (complementary metal oxide semiconductor), SOI (silicon on insulator), SiGe (silicon germanium), organic transistors, and with various types of transistors such as single-gate and multiple-gate (MUGFET) field effect transistors, and with single-electron transistors, and other nano-electronics and other structures. Photonic integrated circuit blocks, components, and interconnects are also suitably applied in various embodiments.

Figure 9:
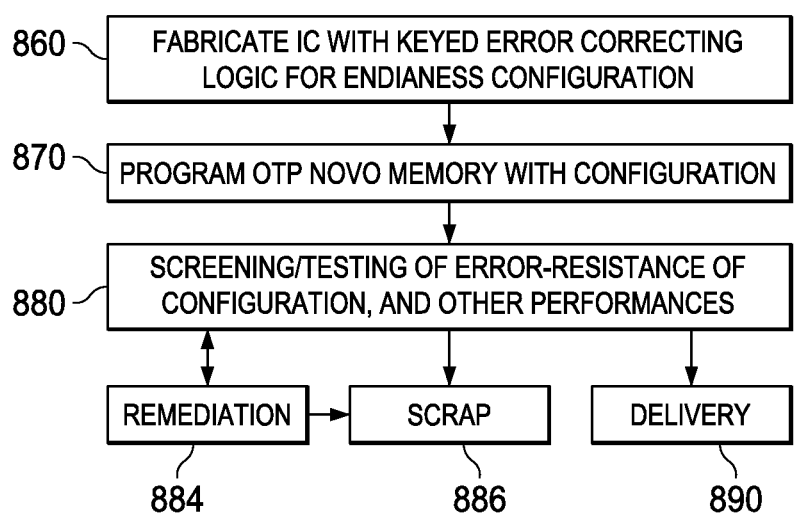
FIG. 9 is a flow diagram of a manufacturing process embodiment to make integrated circuits for increased configuration safety such as for endianess.

FIG. 9 shows a manufacturing process embodiment 850 to make integrated circuits for increased configuration safety such as for endianess. Beforehand, a design process produces a netlist of circuitry as described herein and then generates a physical layout database or pattern generation PG, which is also called a tape-out. In process 850, a step 860 fabricates the integrated circuit in a wafer fabrication facility according to the PG layout that provides e.g. key error-correcting logic for endianess configuration. A succeeding step 870 electronically programs nonvolatile OTP memory with the configuration. Step 880 then powers up the IC and executes a runtime automatic electronic diagnostic process for the configured status, such as endianess status, as described elsewhere hereinabove using e.g. a 3-step diagnostic. Step 880 executes production screening or testing of error-resistance and stability of the configuration, as well as other performances of the chip or system. If the IC is irremediable, it is passed to scrap 886. If the unit has less than satisfactory error-resistance, then the operations of step 884 for remediation are applied if possible. Such remediation can be provided by any of the error-remediation 740 measures described elsewhere herein, or by some microscopic hardware fix, whereupon step 880 is applied further. When a production unit passes screening/testing step 880, it is passed to delivery 890 because it has successfully completed manufacture.

FIG. 10 shows a process embodiment 900 of electronic circuit operation for increased configuration safety such as for endianess. In the process 900, a step 910 reads a key value, and decodes the key into an enable (i.e., an enabling control signal) if the value supplied as the key is the expected value. Then a step 920 responds to the enable and reads a configuration input. A succeeding step 930 encodes at least one bit from the configuration and form a multi-bit encode value. Then a step 940 stores the multi-bit encode value, such as to a register 212 (360). A further step 950 decodes the value in the register using an error correcting method that delivers fewer bits, or even one bit, as a register decode value. In this way, when the multi-bit encode value is altered by fewer than a specified number of errors due to intervening interference, the register decode value delivered by step 950 is the same as if the multi-bit encode value were unaltered and had no errors introduced therein.

After step 950 in FIG. 10, an encoding step 960 encodes register decode value into a multi-bit encode value, which e.g. is identical to the original unaltered multi-bit encode value provided by step 940. Then a step 970 supplies a control output to effectuate the configuration input. For example, FIGS. 3 and 3A provide the control output Endian_Output which in that special case is single-line signal same as the endianess configuration. FIG. 3B shows that control output as multiple lines fed from Correction_Path. Still other types, widths, signals, etc. of control output are devised for other embodiments. A further step 980 determines whether a new enable is present, and if not, operations look back to step 940 to store the encode from step 960 to the register. If a new enable is present, operations instead branch back to step 922 read the configuration and proceed on from step 920. Process embodiment 900 in this way promotes configuration safety, reliability, and error resistance.

A few preferred embodiments have been described in detail hereinabove. It is to be understood that the scope of the invention comprehends embodiments different from those described, as well as the described embodiments, yet within the inventive scope. Implementation is contemplated in discrete components or fully integrated circuits in any materials family and combinations thereof. Processing circuitry comprehends digital, analog and mixed signal (digital/analog) integrated circuits, ASIC circuits, PALs, PLAs, decoders, memories, and programmable and nonprogrammable processors, microcontrollers, digital computers including microprocessors and microcomputers of any architecture, or combinations thereof, and other circuitry. Internal and external couplings and connections can be ohmic, capacitive, inductive, photonic, and direct or indirect via intervening circuits or otherwise as desirable. Process diagrams herein are representative of flow diagrams for operations of any embodiments whether of hardware, software, or firmware, and processes of manufacture thereof. Blocks or flow elements may be omitted, altered, added to, changed in sequence, etc. Flow diagrams and block diagrams are each interpretable as representing structure and/or process. While this invention has been described with reference to illustrative embodiments, this description is not to be construed in a limiting sense. Various modifications and combinations of the illustrative embodiments, as well as other embodiments of the invention may be made. The terms including, having, has, with, or variants thereof are used in the detailed description and/or the claims to denote non-exhaustive inclusion in a manner similar to the term comprising. The appended claims and their equivalents are intended to cover any such embodiments, modifications, and embodiments as fall within the scope of the invention.

What is claimed is:

1. An electronic circuit comprising:
   (A) a data in lead carrying a binary data signal;
   (B) encode and multiplex circuitry having a first input coupled to the data in lead, a second input, a multiplexer control input, and encoded data outputs;
   (C) register circuitry having data inputs coupled to the encoded data outputs, a data output for each data input, and a clock input;
   (D) decode and error correction circuitry having inputs coupled with the data outputs of the register circuitry, a correction path output coupled to the second input of the encode and multiplex circuitry, and a data output; and
   (E) a data out lead coupled to the data output of the decode and error correction circuitry.

2. The circuit of claim 1 including an integrated circuit carrying the data in lead, the encode and multiplex circuitry, the register circuitry, the decode and error correction circuitry, and the data out lead.

3. The circuit of claim 1 in which the register circuitry includes a flip-flop for each data input, each flip-flop having a clock input and including a clock lead coupled to the clock inputs of all of the flip-flops.

4. The circuit of claim 1 including a control lead coupled to the multiplexer control input.

* * * * *